(12) United States Patent
Shahparnia

(10) Patent No.: US 8,026,770 B2
(45) Date of Patent: Sep. 27, 2011

(54) RELAXATION OSCILLATOR

(75) Inventor: Shahrooz Shahparnia, Campbell, CA (US)

(73) Assignee: Synaptics, Inc., Santa Clara, CA (US)

( * ) Notice: Subject to any disclaimer, the term of this patent is extended or adjusted under 35 U.S.C. 154(b) by 78 days.

(21) Appl. No.: 12/496,482

(22) Filed: Jul. 1, 2009

(65) Prior Publication Data

US 2011/0001572 A1    Jan. 6, 2011

(51) Int. Cl.
*H03K 3/282* (2006.01)
*H03B 5/24* (2006.01)

(52) U.S. Cl. ......... 331/143; 331/1 A; 331/111; 331/153; 327/182

(58) Field of Classification Search .................. 331/1 A, 331/111, 143, 153; 327/182
See application file for complete search history.

(56) References Cited

U.S. PATENT DOCUMENTS

| 3,831,113 | A | | 8/1974 | Ahmed |
| 4,623,851 | A | * | 11/1986 | Abou ........................ 331/111 |
| 4,623,852 | A | * | 11/1986 | Abou et al. ................. 331/111 |
| 6,107,894 | A | | 8/2000 | Van Tuijl et al. |
| 6,154,076 | A | | 11/2000 | Hastings |
| 6,278,307 | B1 | | 8/2001 | El-Kik |
| 6,412,977 | B1 | | 7/2002 | Black et al. |
| 6,867,657 | B2 | * | 3/2005 | Hollinger et al. ............. 331/143 |
| 6,882,197 | B2 | | 4/2005 | Griessbach |

OTHER PUBLICATIONS

Flynn, Michael P., et al., "A 1.2-um CMOS Current-Controlled Oscillator", *IEEE Journal of Solid-State Circuits*, vol. 27. No. 7, (Jul. 1992),982-987.

* cited by examiner

*Primary Examiner* — Levi Gannon

(57) ABSTRACT

The relaxation oscillator includes a comparator and a latch. The comparator includes a comparator output and a comparator input that is configured to receive a first input signal in response to a first signal and configured to receive a second input signal in response to a second signal. The latch includes a latch-set input that is configured to be coupled to the comparator output in response to a third signal, a latch-reset input that is configured to be coupled to the comparator output in response to a fourth signal and a latch output that is configured to output the second signal. The relaxation oscillator is configured to achieve an approximately fifty percent duty cycle without requiring the use of a second comparator.

20 Claims, 12 Drawing Sheets

RELAXATION OSCILLATOR

TECHNICAL FIELD

Embodiments of the present invention relate generally to the field of integrated circuits (ICs) and relaxation oscillators used to generate clock signals for ICs.

BACKGROUND

With the spectacular rise of personal computer and telecommunications technology, there has been an equally phenomenal development in the technology of ICs. In particular, with the drive to ever higher levels of circuit integration, the importance of conserving the real estate on a die and minimizing the consumption of power continues to draw the attention of scientists and engineers engaged in the design of ICs.

This is particularly true in the field of capacitance-sensing devices where there is a premium attached to producing devices with small size and minimal power consumption. The elimination of circuit designs which are overdesigned and suffer from inelegant use of the die real estate for integrated circuits used to drive capacitance-sensing devices is an area drawing the continued attention of scientists and engineers engaged in the development of capacitance-sensing devices. Thus, elegant circuit designs that reduce the number of circuit components on a die of an IC and minimize power consumption are of particular interest for maintaining a competitive edge in the field of capacitance-sensing devices and integrated-circuit technology, more generally.

SUMMARY

Embodiments of the present invention include a relaxation oscillator. The relaxation oscillator includes a comparator and a latch. The comparator includes a comparator output and a comparator input that is configured to receive a first input signal in response to a first signal and configured to receive a second input signal in response to a second signal. The latch includes a latch-set input that is configured to be coupled to the comparator output in response to a third signal, a latch-reset input that is configured to be coupled to the comparator output in response to a fourth signal and a latch output that is configured to output the second signal. The relaxation oscillator is configured to achieve an approximately fifty percent duty cycle without requiring the use of a second comparator.

DESCRIPTION OF THE DRAWINGS

The accompanying drawings, which are incorporated in and form a part of this specification, illustrate embodiments of the invention and, together with the description, serve to explain the embodiments of the invention.

The drawings referred to in this description should not be understood as being drawn to scale except if specifically noted.

DESCRIPTION OF EMBODIMENTS

Reference will now be made in detail to the alternative embodiments of the present invention. While the invention will be described in conjunction with the alternative embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description of embodiments of the present invention, numerous specific details are set forth in order to provide a thorough understanding of the present invention. However, it should be noted that embodiments of the present invention may be practiced without these specific details. In other instances, well known methods, procedures, and components have not been described in detail as not to unnecessarily obscure embodiments of the present invention.

Moreover, in the following descriptions of embodiments of the present invention, although specific polarities of individual components and specific polarities of individual signal waveforms are shown, this is for teaching purposes and by way of example without limitation thereto, as other component and signal polarities are encompassed within the spirit and scope embodiments of the present invention. In particular, transistor components may be shown as specific types of transistors; but, other types of transistors from those shown are within the spirit and scope of embodiments of the present invention. For example, transistor components may be shown with portions of a particular conductivity type; but, transistor components with portions having opposite conductivity types from those shown are within the spirit and scope of embodiments of the present invention. Furthermore, timing diagrams for signal waveforms present at various test points of circuit diagrams, which are shown for example embodiments of the present invention, are also for teaching purposes and by way of example without limitation thereto, as alternative timing diagrams are also within the spirit and scope of embodiments of the present invention. For example, signal waveforms of opposite polarity to signal waveforms present at various test points of circuit diagrams shown for example embodiments of the present invention are within the spirit and scope of embodiments of the present invention.

Description of Embodiments of the Present Invention for a Relaxation Oscillator

Figure 1A:
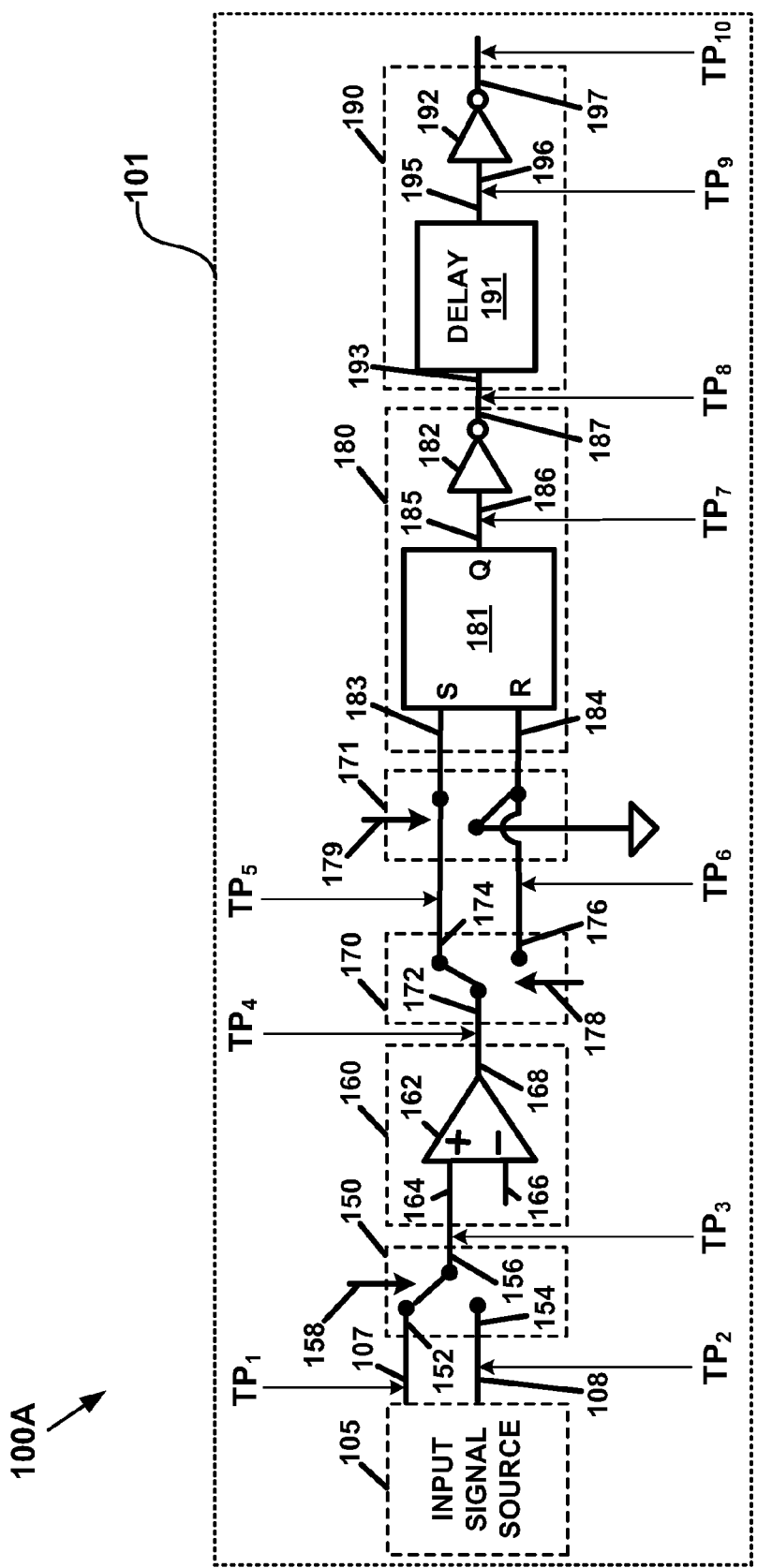
FIG. 1A is a block diagram illustrating an arrangement of electronic components within component blocks and test points for waveforms in a relaxation oscillator configured to achieve an approximately fifty percent duty cycle, in an embodiment of the present invention.

With reference now to FIG. 1A, in accordance with an embodiment of the present invention, a block diagram 100A is shown. The block diagram 100A illustrates an arrangement of electronic components within component blocks of an example relaxation oscillator 101 configured to achieve an approximately fifty percent duty cycle. Although for teaching purposes the example relaxation oscillator 101 of FIG. 1A may be referred to, embodiments of the present invention also apply to various other types of oscillators, and are well suited to various other types of oscillators using different components or different arrangements of the components shown in FIG. 1A. The block diagram 100 also shows the location of test points for waveforms of signals in the example relaxation oscillator 101. The example relaxation oscillator 101 may include the following components: an input signal source 105, a first switching mechanism 150, a comparator block 160, a second switching mechanism 170, a fourth switching mechanism 171, a latching block 180, and a delay block 190. The configuration of internal component parts of the above listed components within the example relaxation oscillator 101 is subsequently described.

Figure 1B:
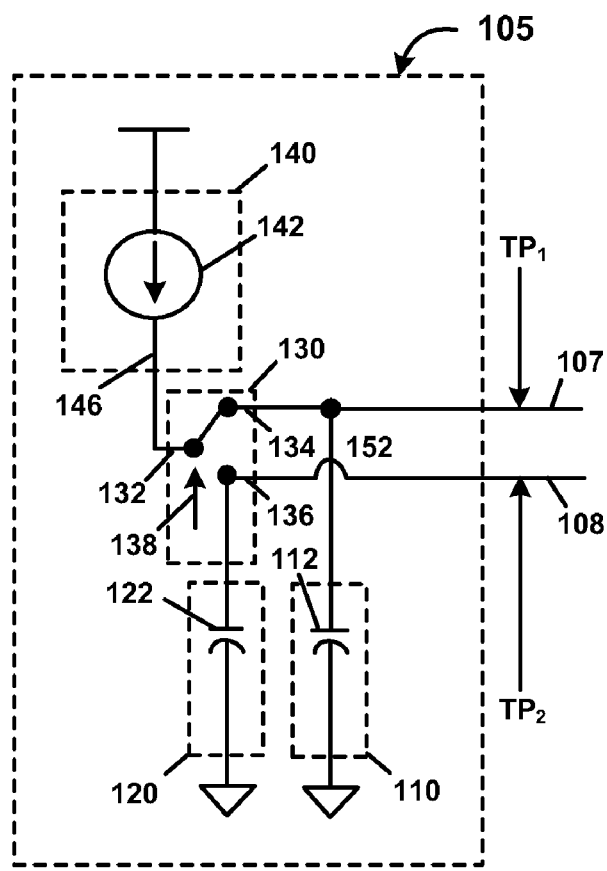
FIG. 1B is a block diagram illustrating an arrangement of electronic components within component blocks of an input signal source of an oscillator, such as the example relaxation oscillator of FIG. 1A, in an embodiment of the present invention.

With reference now to FIG. 1B, in accordance with an embodiment of the present invention, a block diagram 100B is shown. The block diagram 100B illustrates an arrangement of electronic components within component blocks of an example input signal source 105 of an oscillator, such as the example relaxation oscillator of FIG. 1A. Although for teaching purposes the example input signal source 105 of FIG. 1B may be referred to, embodiments of the present invention also apply to various other types of input signal sources, and are well suited to various other types of input signal sources using different components or different arrangements of the components shown in FIG. 1B. In accordance with one embodiment of the present invention, the input signal source 105 may include a first input signal generator 110, a second input signal generator 120, a charging mechanism 140 and a third switching mechanism 130. In an embodiment of the present invention, the first input signal generator 110 may include, by way of example without limitation thereto, a first capacitor 112; in addition, the first input signal generator 110 may also include a first resistor (not shown) electrically coupled in series with the first capacitor 112. In one embodiment of the present invention, the second input signal generator 120 may include, by way of example without limitation thereto, a second capacitor 122; in addition, the first input signal generator 120 may also include a second resistor (not shown) electrically coupled in series with the second capacitor 122. In another embodiment of the present invention, the first and second input signal generators 110 and 120 are electrically coupled to the charging mechanism 140 by means of the third switching mechanism 130; the first input signal generator 110 is connected in common with a first output 134 of the third switching mechanism 130; and, the second input signal generator 120 is connected in common with a second output 136 of the third switching mechanism 130. In one embodiment of the present invention, in response to a signal 138, the third switching mechanism 130 alternately couples the first input signal generator 110 and the second input signal generator 120 to the charging mechanism 140 through the input 132 of the third switching mechanism 130 that is electrically coupled to output 146 of the charging mechanism 140. The charging mechanism 140 may include, by way of example without limitation thereto, a current source 142. Alternatively, in another embodiment of the present invention, the charging mechanism 140 may include a voltage source and/or a resistor (not shown). As shown in FIG. 1A, the arrangement of the charging mechanism 140, the third switching mechanism 130 and the first and second input signal generators 110 and 120 are configured to generate a first waveform and a second waveform, which appear respectively on a first input-signal-source output 107 at a first test point, $TP_1$, and on a second input-signal-source output 108 at a second test point, $TP_2$, respectively. In accordance with an embodiment of the present invention, the first and second input signal generators 110 and 120 may be further coupled to a discharging mechanism (not shown), which may also include respective resistors and switches, without limitation thereto, for each of the first and second input signal generators 110 and 120.

With further reference to FIG. 1A, in accordance with an embodiment of the present invention, the first switching mechanism 150 includes a first input 152, a second input 154 and a first switching mechanism output 156. The first input 152 of the first switching mechanism 150 is electrically coupled to the first output 134 of the third switching mechanism 130 through the first input-signal-source output 107; and, the second input 154 of the first switching mechanism 150 is electrically coupled to the second output 136 of the third switching mechanism 130 through the second-input-signal source output 108. In response to signal 158, the first switching mechanism 150 alternately couples the first input 152 and the second input 154 to the first switching mechanism output 156. The comparator block 160 includes, by way of example without limitation thereto, a comparator 162, a comparator input 164, a reference voltage input 166 and comparator output 168. In one embodiment of the present invention, the comparator 162 may be an operational amplifier. The comparator input 164 is electrically coupled to the first switching mechanism output 156; the first switching mechanism 150 is configured so that a third waveform may appear at third test point, $TP_3$, which is located at a point electrically in common to both the comparator input 164 and the first switching mechanism output 156. The second switching mechanism 170 includes a second switching mechanism input 172, a first output 174 and a second output 176. The second switching mechanism input 172 is electrically coupled to the comparator output 168; the comparator block 160 is configured so that a fourth waveform may appear at fourth test point, $TP_4$, which is located at a point electrically in common to both the comparator output 168 and the second switching mechanism input 172. In response to signal 178, the second switching mechanism 170 alternately couples the second switching mechanism input 172 to the first output 174 of the second switching mechanism 170 and the second output 176 of the second switching mechanism 170. The second switching mechanism 170 is configured so that a fifth waveform may appear at fifth test point, $TP_5$, which is located at a point electrically in common with the first output 174 of the second switching mechanism 170, and so that a sixth waveform may appear at sixth test point, $TP_6$, which is located at a point electrically in common with the second output 176 of the second switching mechanism 170.

Figure 2:
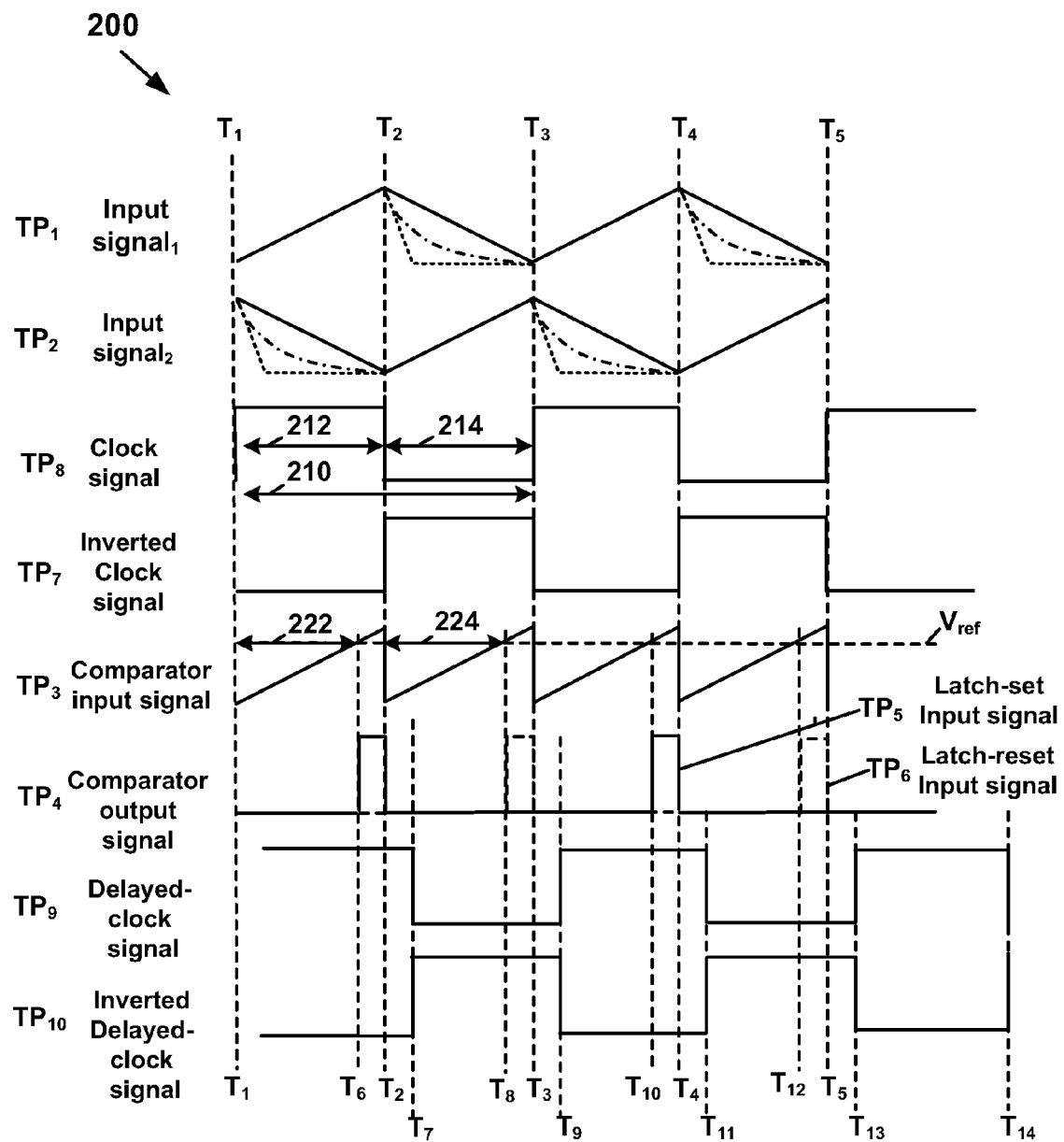
FIG. 2 is a timing diagram illustrating the waveforms at the various test points of the block diagram of FIG. 1A, in an embodiment of the present invention.

With further reference to FIG. 1A, in accordance with an embodiment of the present invention, the latching block 180 includes a latch 181, an inverter 182, a latch-set input 183, a latch-reset input 184, a latch output 185, an inverter input 186 and an inverter output 187. The latch-set input 183 is electrically coupled to the first output 174 of the second switching mechanism 170; and, the latch-reset input 184 is electrically coupled to the second output 176 of the second switching mechanism 170. In one embodiment of the present invention, the example relaxation oscillator 101 may also include a fourth switching mechanism 171, which is configured to couple the latch-set input 183 and the latch-reset input 184 to ground in response to a signal 179 whenever either the latch-reset input 184 or the latch-set input 183 are respectively disconnected from the comparator output 168 through the action of second switching mechanism 170. For example, as shown in FIG. 1A, when the latch-reset input 184 is electrically coupled through the second output 176 of the second switching mechanism 170 to the comparator output 168 through the second switching mechanism input 172, the latch-set input 183 is electrically coupled through the fourth switching mechanism 171 to ground in response to signal 179. Similarly, when the latch-set input 183 is electrically coupled through the first output 174 of the second switching mechanism 170 to the comparator output 168 through the second switching mechanism input 172, the latch-reset input 184 is electrically coupled through the fourth switching mechanism 171 to ground in response to signal 179. Thus, in an embodiment of the present invention, signal 179 is synchronized with signal 178 so that, when signal 178 closes the second switching mechanism 170 to either the latch-set input 183, or the latch-reset input 184, signal 179 grounds the latch-reset input 184, or the latch-set input 183, respectively. Thus, the fourth switching mechanism 171 is configured to provide that the waveforms at the fifth test point, $TP_5$, and at the sixth test point, $TP_6$, are those that are shown in FIG. 2, which is subsequently described. The latch output 185 is electrically coupled to the inverter input 186. The latch 181 is configured so that a seventh waveform may appear at seventh test point, $TP_7$, which is located at a point electrically in common with both the latch output 185 and the inverter input 186. The latch-set input 183 and the latch-reset input 184 serve as a pair of inputs to the latch 181 of the latching block 180; and, the inverter output 187 serves as an output from the latching block 180. The inverter 182 of the latching block 180 is configured so that an eighth waveform may appear at eighth test point, $TP_8$, which is located at a point electrically in common with inverter output 187 of the inverter 182. Although not directly shown in FIG. 1A, in an embodiment of the present invention, the signals present at the seventh test point, $TP_7$, and at the eighth test point, $TP_8$, may be used for feedback to control the various switching mechanisms of the example relaxation oscillator 101, as will be subsequently described in the discussion of FIG. 2. Although for teaching purposes the latching block 180 of FIG. 1A may be referred to, embodiments of the present invention also apply to various other types of latching blocks, and are well suited to various other types of latching blocks using different components or different arrangements of the components of the latching block 180 shown in FIG. 1A. For example, in one embodiment of the present invention, the latching block 180 may include a latch with an integrated inverter and both a latch output, similar to latch output 185, and an inverted latch output, similar to inverter output 187, from the latching block 180.

With further reference to FIG. 1A, in accordance with an embodiment of the present invention, the delay block 190 includes a delay circuit 191, an inverter 192, a delay circuit input 193, a delay circuit output 195, an inverter input 196 and an inverter output 197. The delay circuit input 193 is electrically coupled to the inverter output 187 of the inverter 182 of the latching block 180. The delay circuit output 195 is electrically coupled to the inverter input 196. The delay circuit 191 is configured so that a ninth waveform may appear at ninth test point, $TP_9$, which is located at a point electrically in common with both the delay circuit output 195 and the inverter input 196. The delay circuit input 193 serves as an input to the delay circuit 191 of the delay block 190; and, the inverter output 197 serves as an output from the delay block 190. The inverter 192 of the delay block 190 is configured so that a tenth waveform may appear at tenth test point, $TP_{10}$, which is located at a point electrically in common with inverter output 197 of the inverter 192. Although not directly shown in FIG. 1A, in an embodiment of the present invention, the signals present at the ninth test point, $TP_9$, and at the tenth test point, $TP_{10}$, may be used for feedback to control the various switching mechanisms of the example relaxation oscillator 101, as will be subsequently described in the discussion of FIG. 2. Although for teaching purposes the delay block 190 of FIG. 1A may be referred to, embodiments of the present invention also apply to various other types of delay blocks, and are well suited to various other types of delay blocks using different components or different arrangements of the components of the delay block 190 shown in FIG. 1A. For example, in one embodiment of the present invention, the delay block 190 may include a delay circuit with an integrated inverter and both a delay circuit output, similar to delay circuit output 195, and an inverted delay circuit output, similar to inverter output 197, from the delay block 190.

With reference now to FIG. 2, in accordance with an embodiment of the present invention, a timing diagram 200 is shown. Although certain waveforms may be shown in FIG. 2, various types of waveforms may be used as input signals: a sawtooth waveform, a periodically repeating triangle waveform, a waveform with repeating, alternating RC-charging and RC-discharging portions, a waveform with repeating portions of sinusoidal waveforms, for example, a waveform with a repeating quarter-sinusoid portion, as well as other periodic waveforms; the preceding list is not meant to be exhaustive, as a variety of waveforms is within the spirit and scope of embodiments of the present invention. The timing diagram 200 shows waveforms that may appear at the various test points of the block diagram of FIG. 1A, displayed along a common time base. At $TP_1$, the first waveform corresponds to a first input signal, $input\ signal_1$, from the first input signal generator 110; and, at $TP_2$, the second waveform corresponds to a second input signal, $input\ signal_2$, from the second input signal generator 120. As shown in FIG. 2, both the first input signal, $input\ signal_1$, and the second input signal, $input\ signal_2$, may include periodically repeating waveforms, which include repeating waveform portions. For example, first input signal, $input\ signal_1$, includes a first portion, which may be, by way of example without limitation thereto, a positive-going ramp portion between time, $T_1$, and time, $T_2$, which corresponds to a waveform produced by charging of first capacitor 112 when first capacitor 112 is coupled through third switching mechanism 130 to current source 142 of charging mechanism 140. By way of further example, first input signal, input signal$_1$, includes a second portion, which may be, by way of example without limitation thereto, any waveform portion that starts at the end of the positive-going ramp portion at time, $T_2$, and reaches a zero level at or before time, $T_3$. For example, in one embodiment of the present invention, a negative-going ramp portion shown by the solid line between time, $T_2$, and time, $T_3$, that reaches a zero level at time, $T_3$, which corresponds to a waveform produced by discharging of first capacitor 112 when first capacitor 112 is coupled through a switching mechanism (not shown) to a current source (not shown). As used herein, the term of art, "zero level" means any level below reference voltage, $V_{ref}$, on reference voltage input 166 of comparator 162, including ground and zero volts. For example, in another embodiment of the present invention, a RC-discharge portion shown by the dot-dash line between time, $T_2$, and time, $T_3$, which corresponds to a waveform produced by discharging first capacitor 112 with capacitance value, C, when first capacitor 112 is discharged through a discharging mechanism (not shown) having a series resistance value, R. For example, in yet another embodiment of the present invention, a negative-going ramp portion shown by the dotted line between time, $T_2$, and time, $T_3$, that reaches a zero level before time, $T_3$, which corresponds to a waveform produced by discharging of first capacitor 112 when first capacitor 112 is coupled through a switching mechanism (not shown) to a current source (not shown) or zero level. Thus, a repeating waveform portion of the first input signal, input signal$_1$, may include the first portion between time, $T_1$, and time, $T_2$, and a second portion between time, $T_2$, and time, $T_3$, which is replicated between time, $T_3$, and time, $T_5$, and includes a repeated positive-going ramp portion between time, $T_3$, and time, $T_4$, and a repeated waveform portion that starts at the end of the positive-going ramp portion at time, $T_4$, and reaches a zero level at or before time, $T_5$. Although the waveforms as shown in FIG. 2 are shown repeating over a limited number of periods, this is by way of example and not limitation thereto, as waveforms that repeat over periods greater than the number of periods shown in FIG. 2 are within the spirit and scope of embodiments of the present invention.

With further reference to FIG. 2, in accordance with an embodiment of the present invention, similarly, second input signal, input signal$_2$, includes a first portion, which may be, by way of example without limitation thereto, any waveform portion that starts at a positive level equal to the maximum amplitude of a positive-going ramp portion between time, $T_2$, and time, $T_3$, at time, $T_1$, and reaches a zero level at or before time, $T_2$. For example, in one embodiment of the present invention, a negative-going ramp portion shown by the solid line between time, $T_1$, and time, $T_2$, that reaches a zero level at time, $T_2$, which corresponds to a waveform produced by discharging of first capacitor 122 when first capacitor 122 is coupled through a switching mechanism (not shown) to a current source (not shown) or zero level. For example, in another embodiment of the present invention, a RC-discharge portion shown by the dot-dash line between time, $T_1$, and time, $T_2$, which corresponds to a waveform produced by discharging second capacitor 122 with capacitance value, C, when second capacitor 122 is discharged through a discharging mechanism (not shown) having a series resistance value, R. For example, in yet another embodiment of the present invention, a negative-going ramp portion shown by the dotted line between time, $T_1$, and time, $T_2$, that reaches a zero level before time, $T_2$, which corresponds to a waveform produced by discharging of first capacitor 122 when first capacitor 122 is coupled through a switching mechanism (not shown) to a current source (not shown) or zero level. By way of further example, second input signal, input signal$_2$, includes a second portion, which may be, by way of example without limitation thereto, a positive-going ramp portion between time, $T_2$, and time, $T_3$, which corresponds to a waveform produced by charging of second capacitor 122 when second capacitor 122 is coupled through third switching mechanism 130 to current source 142 of charging mechanism 140. Thus, a repeating waveform portion of the second input signal, input signal$_2$, may include the first portion between time, $T_1$, and time, $T_2$, and a second portion between time, $T_2$, and time, $T_3$, which is replicated between time, $T_3$, and time, $T_5$, and includes a waveform portion that starts at the end of the positive-going ramp portion at time, $T_3$, and reaches a zero level at or before time, $T_4$, between time, $T_3$, and time, $T_4$, and a repeated positive-going ramp portion between time, $T_4$, and time, $T_5$.

With further reference to FIG. 2, in accordance with an embodiment of the present invention, at $TP_3$, the third waveform corresponds to a comparator input signal of the comparator block 160; and, at $TP_4$, the fourth waveform corresponds to a comparator output signal of the comparator block 160. As shown in FIG. 2, the comparator input signal includes, by way of example without limitation thereto, a first portion, which may be a positive-going ramp portion between time, $T_1$, and time, $T_2$, corresponding to the positive-going ramp portion of the first input signal, input signal$_1$, and a second portion, which may be a positive-going ramp portion between time, $T_2$, and time, $T_3$, corresponding to the positive-going ramp portion of the second input signal, input signal$_2$. Thus, the comparator input signal is a composite signal of portions of both the first input signal and the second input signal; and, consequently, since the first input signal and the second input signal are periodically repeating waveforms, the comparator input signal is also a periodically repeating waveform so that a repeating waveform portion between time, $T_1$, and time, $T_3$, including the positive-going ramp portion between time, $T_1$, and time, $T_2$, and the positive-going ramp portion between time, $T_2$, and time, $T_3$, is replicated between time, $T_3$, and time, $T_5$. The comparator output signal includes, by way of example without limitation thereto, a first triggering signal between time, $T_1$, and time, $T_2$, which may include a first pulse portion between time, $T_6$, and time, $T_2$, and a second triggering signal between time, $T_2$, and time, $T_3$, which may include a second pulse portion between time, $T_8$, and time, $T_3$. The comparator output signal is also a periodically repeating waveform so that a repeating waveform portion between time, $T_1$, and time, $T_3$, including the first triggering signal between time, $T_1$, and time, $T_2$, and second triggering signal between time, $T_2$, and time, $T_3$, is replicated between time, $T_3$, and time, $T_5$. The first triggering signal between time, $T_1$, and time, $T_2$, is replicated between time, $T_3$, and time, $T_4$; the first pulse portion between time, $T_6$, and time, $T_2$, is replicated between time, $T_{10}$, and time, $T_4$; the second triggering signal between time, $T_2$, and time, $T_3$, is replicated between time, $T_4$, and time, $T_5$; the second pulse portion between time, $T_8$, and time, $T_3$, is replicated between time, $T_{12}$, and time, $T_5$.

With further reference to FIG. 2, in accordance with an embodiment of the present invention, at $TP_5$, the fifth waveform corresponds to a latch-set input signal for the latch 181; and, at $TP_6$, the sixth waveform corresponds to a latch-reset input signal for the latch 181. As shown in FIG. 2, the fourth waveform of the comparator output signal includes both the fifth waveform of the latch-set input signal and the sixth waveform of the latch-reset input signal. Thus, the fourth waveform of the comparator output signal may be decomposed into the fifth waveform of the latch-set input signal at $TP_5$ and the sixth waveform of the latch-reset input signal at $TP_6$ by the action of the second switching mechanism 170 in response to signal 178. Further, in one embodiment, the width of each of the fifth and sixth waveforms is proportional to the sum of the delay of comparator 162 and the delay of latch 181. In other words, the width of each pulse portion between $T_6$ and $T_2$, $T_8$ and $T_3$, $T_{10}$ and $T_4$ and $T_{12}$ and $T_5$ is proportional to the sum of the delay of comparator 162 and the delay of latch 181. The fifth waveform of the latch-set input signal is input to the latch-set input 183 of the latch 181; and, the sixth waveform of the latch-reset input signal is input to the latch-reset input 184 of the latch 181. Consequently, the latch output 185 is toggled high and low in response to the latch-set input signal and the latch-reset input signal producing the seventh waveform of an inverted clock signal at $TP_7$. There may also be a delay associated with the latch 181 introduced into the inverted clock signal similar to the delay introduced by the comparator block 160; but, the delay associated with the latch 181 is not shown in FIG. 2 so as not to obscure the description. At $TP_8$, on the inverter output 187 of the inverter 182, the eighth waveform corresponds to a clock signal which is the inversion of the inverted clock signal produced by the inverter 182 of the latching block 180.

With further reference to FIG. 2, in accordance with an embodiment of the present invention, at $TP_9$ on the delay circuit output 195, the ninth waveform corresponds to a delayed clock signal introduced by the delay circuit 191 in processing the clock signal input on the delay circuit input 193. At $TP_{10}$, on the inverter output 197 of the inverter 192 of the delay block 190, the tenth waveform corresponds to an inverted delayed clock signal which is the inversion of the delayed clock signal produced by the inverter 192 of the delay block 190. In one embodiment, the ninth waveform of the delayed clock signal is delayed by a delay time that is greater than combined delay times of switching mechanism 170 and comparator block 160. In another embodiment, as shown in FIG. 2, the ninth waveform of the delayed clock signal is delayed by a delay time shown as a time interval between time, $T_2$, and time, $T_7$. In one embodiment, the ninth waveform of the delayed clock signal is delayed by a delay time selected from a range of delay times including 6-10 ns. In another embodiment, the ninth waveform of the delayed clock signal is delayed by a delay time that is predetermined. In a further embodiment, the ninth waveform of the delayed clock signal is delayed by a delay time where the delay time ensures that the coupling of comparator output 168 with either the latch-set input 183 and the latch-reset input 184 through switching mechanism 170 is properly synchronized. The signals at $TP_7$, $TP_8$, $TP_9$, and $TP_{10}$ provide positive feedback at various points in the circuit of the example relaxation oscillator 101, namely by providing the respective signals 138, 158 and 178 to the switching mechanisms 130, 150 and 170, the configuration of which is next described.

Figure 3A:
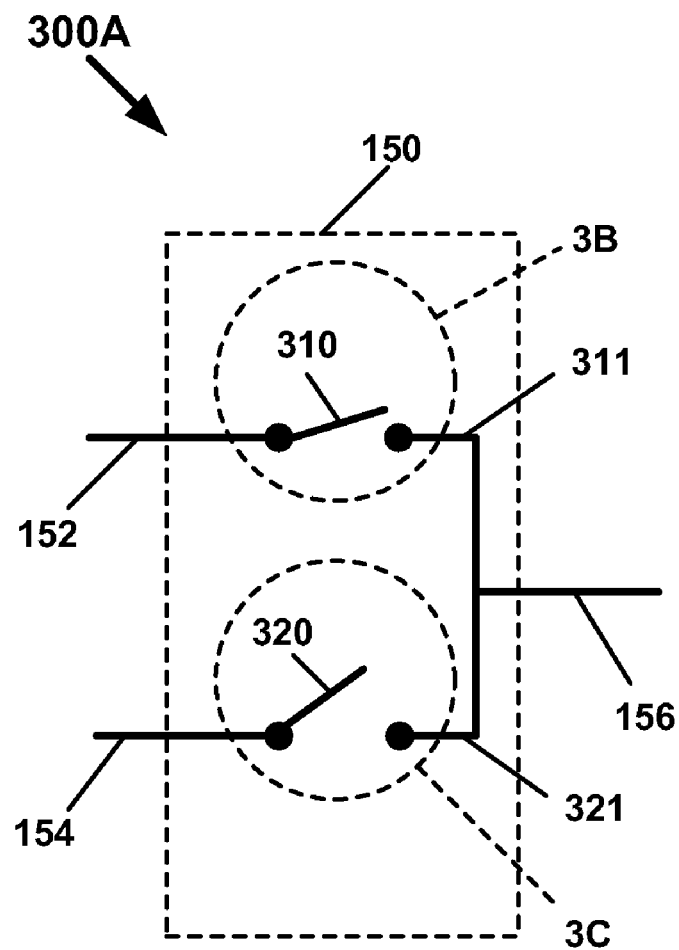
FIG. 3A is a circuit diagram illustrating a switch configuration of a first switch and a second switch within a first switching mechanism of an oscillator, such as the example relaxation oscillator of FIG. 1A, in an embodiment of the present invention.

With reference now to FIG. 3A, in accordance with one embodiment of the present invention, a circuit diagram 300A is shown that illustrates a switch configuration of the first switching mechanism 150 of an oscillator, such as the example relaxation oscillator 101 of FIG. 1A. The first switching mechanism 150 includes a first switch 310, which is enclosed in circle 3B, and a second switch 320, which is enclosed in circle 3C. The first switch 310 closes in response to the signal 158 and creates continuity between the first input 152 of the first switching mechanism 150 and the first switching mechanism output 156, by means of an output 311 of first switch 310 electrically coupled to the first switching mechanism output 156. The second switch 320 opens in response to the signal 158 and breaks continuity between the second input 154 of the first switching mechanism 150 and the first switching mechanism output 156, by means of an output 321 of second switch 320 electrically coupled to the first switching mechanism output 156. In one embodiment of the present invention, the signal 158 includes the clock signal of $TP_8$.

Figure 3B:
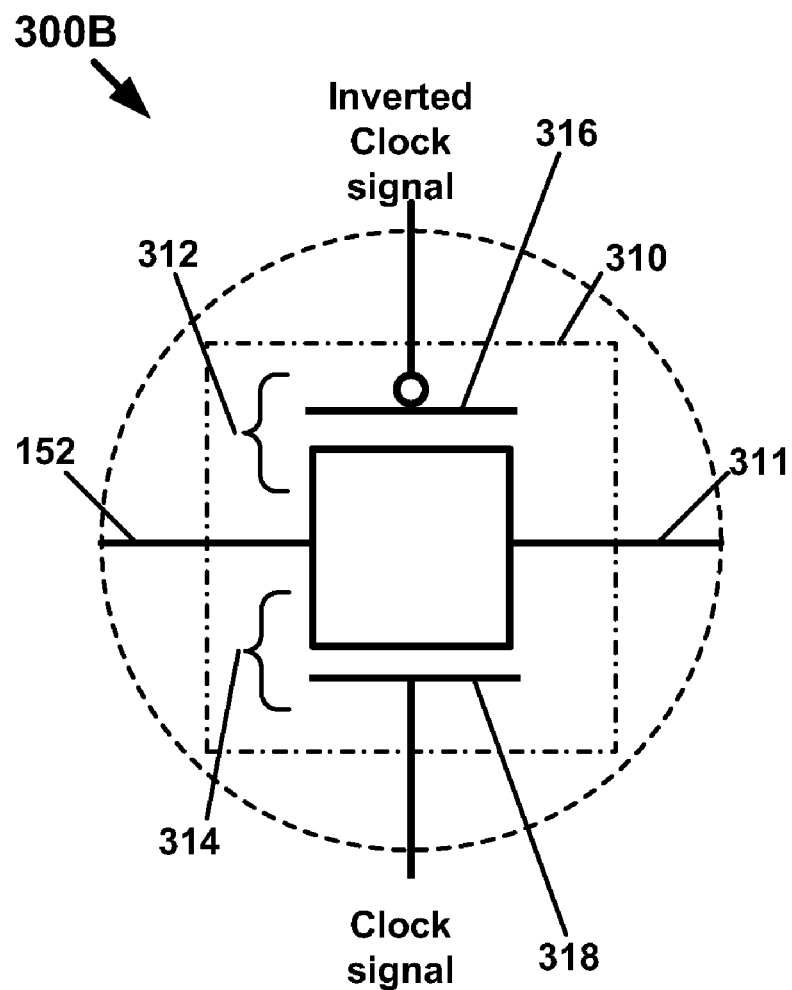
FIG. 3B is a circuit diagram illustrating an arrangement of field effect transistors (FETs) within the first switch of the first switching mechanism of an oscillator, such as the example relaxation oscillator of FIG. 1A, in an embodiment of the present invention.

With reference now to FIG. 3B, in accordance with another embodiment of the present invention, a circuit diagram 300B of the first switch 310 that is enclosed in circle 3B is shown; circuit diagram 300B illustrates an arrangement of field effect transistors (FETs) within the first switch 310 of the first switching mechanism 150 of an oscillator, such as the example relaxation oscillator 101 of FIG. 1A. The first switch 310 of the first switching mechanism 150 includes an n-channel FET (n-FET) 314 and may also include a p-channel FET (p-FET) 312, which may be connected in parallel; the source of the p-FET 312 may be electrically coupled to the source of the n-FET 314, which may be electrically coupled in common with the first input 152 of the first switching mechanism 150; and, the drain of the p-FET 312 may be electrically coupled to the drain of the n-FET 314, which may be electrically coupled in common with the output 311 of the first switch 310, which is electrically coupled to the first switching mechanism output 156 of the first switching mechanism 150. The signal 158, which may include the clock signal of $TP_8$, may be applied to gate 318 of the n-FET 314 so that the channel of n-FET 314 goes to a low resistance state when the clock signal goes high, which effectively closes the first switch 310. If the first switch 310 is also provided with the p-FET 312, the signal 158 may also include the inverted clock signal of $TP_7$, which may be applied to gate 316 of the p-FET 312 so that the channel of p-FET 312 goes to a low resistance state when the inverted clock signal goes low, which also effectively closes the first switch 310. Thus, in an embodiment of the present invention, the signal 158 may include a first signal, which may be a clock signal applied to the gate 318 of the n-FET 314, and a second signal, which may be an inverted clock signal applied to the gate 316 of the p-FET 312. On the other hand, if the clock signal goes low, the gate 318 of the n-FET 314 goes low, which effectively opens the first switch 310. If the first switch 310 is also provided with the p-FET 312, the signal 158 may also include the inverted clock signal applied to the gate 316 of the p-FET 312 so that when the inverted clock signal goes high, first switch 310 effectively opens. Thus, the p-FET 312 provides a complimentary path for the input signal of the first switch 310, which increases the conductance of the first switching mechanism 150.

Figure 3C:
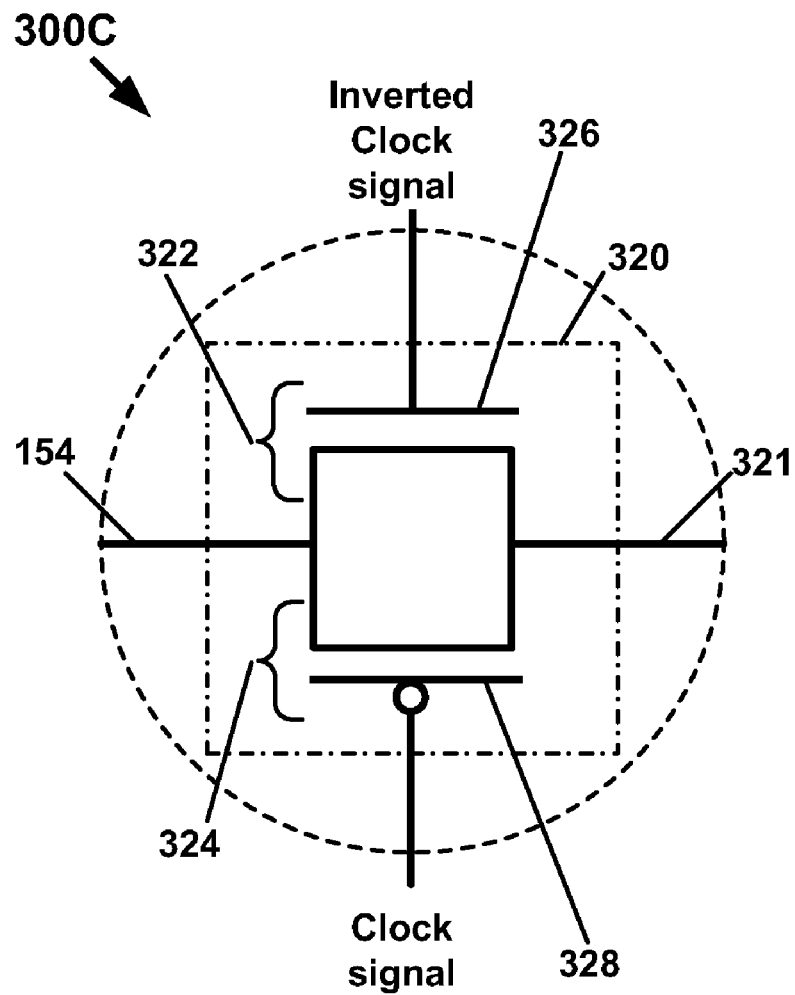
FIG. 3C is a circuit diagram illustrating an arrangement of FETs within the second switch of the first switching mechanism of an oscillator, such as the example relaxation oscillator of FIG. 1A, in an embodiment of the present invention.

With reference now to FIG. 3C, in accordance with another embodiment of the present invention, a circuit diagram 300C of the second switch 320 that is enclosed in circle 3C is shown; circuit diagram 300C illustrates an arrangement of FETs within the second switch 320 of the first switching mechanism 150 of an oscillator, such as the example relaxation oscillator 101 of FIG. 1A. The second switch 320 of the first switching mechanism 150 includes an n-FET 322 and may also include a p-FET 324, which may be connected in parallel; the source of the p-FET 324 may be electrically coupled to the source of the n-FET 322, which may be electrically coupled in common with the second input 154 of the first switching mechanism 150; and, the drain of the p-FET 324 may be electrically coupled to the drain of the n-FET 322, which may be electrically coupled in common with the output 321 of the second switch 320, which is electrically coupled to the first switching mechanism output 156 of the first switching mechanism 150. The signal 158, which may include the inverted clock signal of TP$_7$, may be applied to gate 326 of the n-FET 322 so that the channel of n-FET 322 goes to a high resistance state when the inverted clock signal goes low, which effectively opens the second switch 320. If the second switch 320 is also provided with the p-FET 324, the signal 158 may also include the clock signal of TP$_8$, which may be applied to gate 328 of the p-FET 324 so that the channel of p-FET 324 goes to a high resistance state when the clock signal goes high, which also effectively opens the second switch 320. Thus, in an embodiment of the present invention, the signal 158 may include a first signal, which may be a clock signal applied to the gate 328 of the p-FET 324, and a second signal, which may be an inverted clock signal applied to the gate 326 of the n-FET 322. On the other hand, if the inverted clock signal goes high, the gate 326 of the n-FET 322 goes high, which effectively closes the second switch 320. If the second switch 320 is also provided with the p-FET 324, the signal 158 may also include the clock signal applied to the gate 328 of the p-FET 324 so that when the clock signal goes low, second switch 320 effectively closes. Thus, the p-FET 324 also provides a complimentary path for the input signal of the second switch 320, which increases the conductance of the first switching mechanism 150.

Figure 3D:
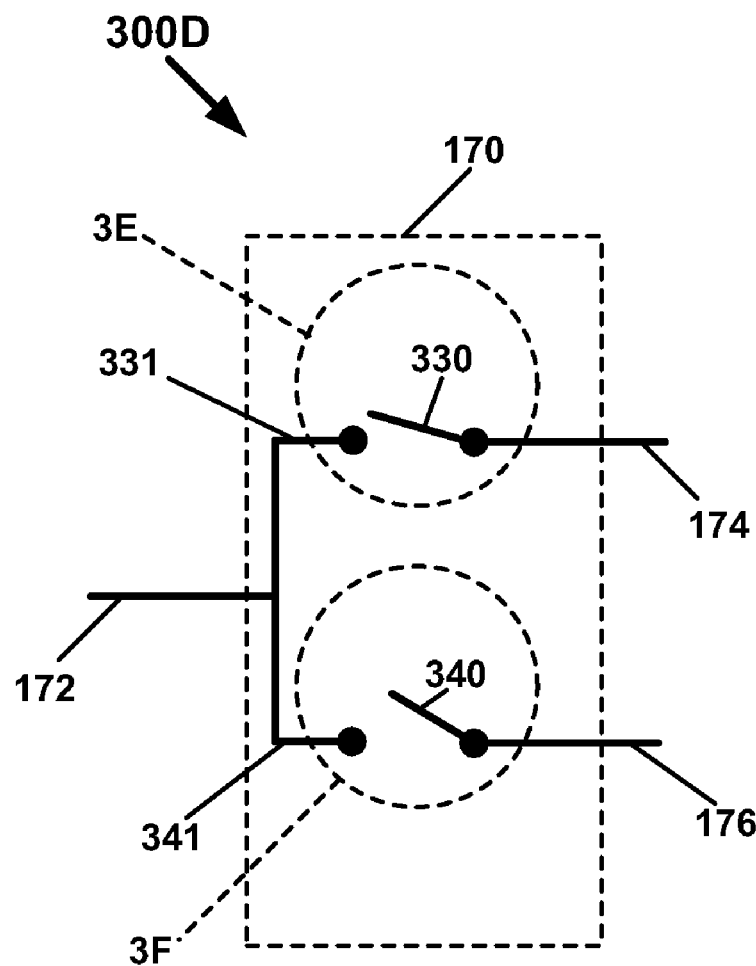
FIG. 3D is a circuit diagram illustrating a switch configuration of a first switch and a second switch within a second switching mechanism of an oscillator, such as the example relaxation oscillator of FIG. 1A, in an embodiment of the present invention.

With reference now to FIG. 3D, in accordance with one embodiment of the present invention, a circuit diagram 300D is shown that illustrates a switch configuration of the second switching mechanism 170 of an oscillator, such as the example relaxation oscillator 101 of FIG. 1A. The second switching mechanism 170 includes a first switch 330, which is enclosed in circle 3E, and a second switch 340, which is enclosed in circle 3F. The first switch 330 closes in response to the signal 178 and creates continuity between the first output 174 of the second switching mechanism 170 and the second switching mechanism input 172, by means of an input 331 of first switch 330 electrically coupled to the second switching mechanism input 172. The second switch 340 opens in response to the signal 178 and breaks continuity between the second output 176 of the second switching mechanism 170 and the second switching mechanism input 172, by means of an input 341 of second switch 340 electrically coupled to the second switching mechanism input 172. In one embodiment of the present invention, the signal 178 includes the delayed clock signal of TP$_9$.

Figure 3E:
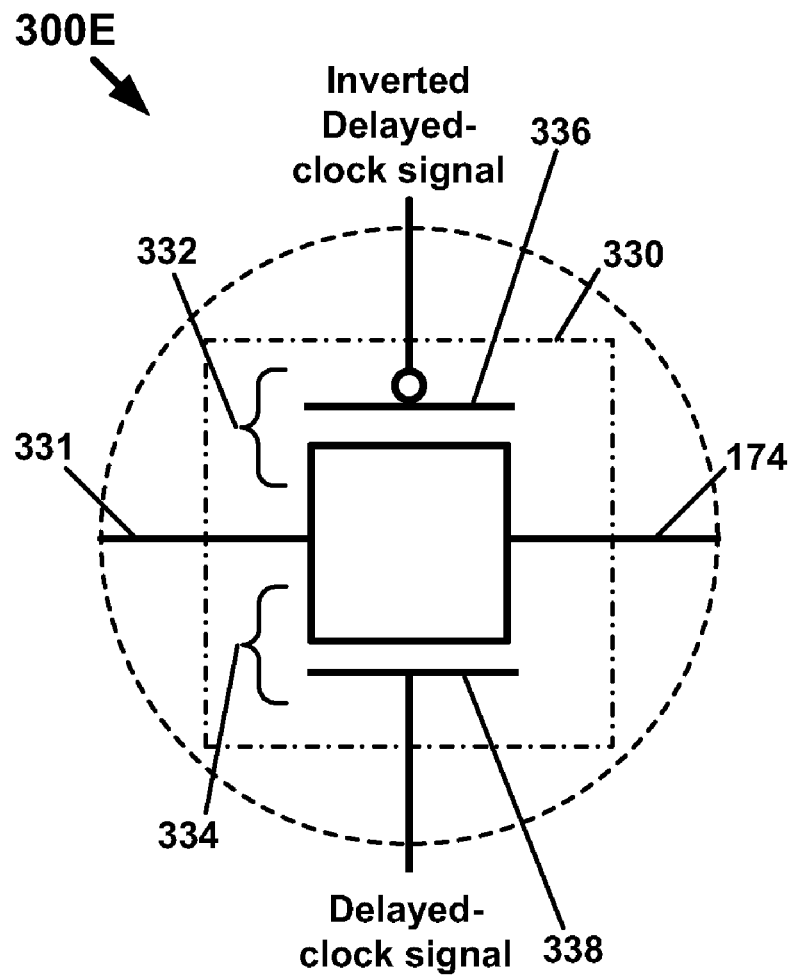
FIG. 3E is a circuit diagram illustrating an arrangement of FETs within the first switch of the second switching mechanism of an oscillator, such as the example relaxation oscillator of FIG. 1A, in an embodiment of the present invention.

With reference now to FIG. 3E, in accordance with another embodiment of the present invention, a circuit diagram 300E of the first switch 330 that is enclosed in circle 3E is shown; circuit diagram 300E illustrates an arrangement of FETs within the first switch 330 of the second switching mechanism 170 of an oscillator, such as the example relaxation oscillator 101 of FIG. 1A. The first switch 330 of the second switching mechanism 170 includes an n-FET 334 and may also include a p-FET 332, which may be connected in parallel; the drain of a p-FET 332 may be electrically coupled to the drain of the n-FET 334, which may be electrically coupled in common with the first output 174 of the second switching mechanism 170; and, the source of the p-FET 332 may be electrically coupled to the source of the n-FET 334, which may be electrically coupled in common with the input 331 of the first switch 330, which is electrically coupled to the second switching mechanism input 172 of the second switching mechanism 170. The signal 178, which may include delayed clock signal of TP$_9$, may be applied to gate 338 of the n-FET 334 so that the channel of n-FET 334 goes to a low resistance state when the delayed clock signal goes high, which effectively closes the first switch 330. If the first switch 330 is also provided with the p-FET 332, the signal 178 may also include the inverted delayed clock signal of TP$_{10}$, which may be applied to gate 336 of the p-FET 332 so that the channel of p-FET 332 goes to a low resistance state when the inverted delayed clock signal goes low, which also effectively closes the first switch 330. Thus, in an embodiment of the present invention, the signal 178 may include a third signal, which may be a delayed clock signal applied to the gate 338 of the n-FET 334, and a fourth signal, which may be an inverted delayed clock signal applied to the gate 336 of the p-FET 332. On the other hand, if the delayed clock signal goes low, the gate 338 of the n-FET 334 goes low, which effectively opens the first switch 330. If the first switch 330 is also provided with the p-FET 332, the signal 178 may also include the inverted delayed clock signal applied to the gate 336 of the p-FET 332 so that when the inverted delayed clock signal goes high, first switch 330 effectively opens. Thus, the p-FET 332 provides a complimentary path for the input signal of the first switch 330, which increases the conductance of the second switching mechanism 170.

Figure 3F:
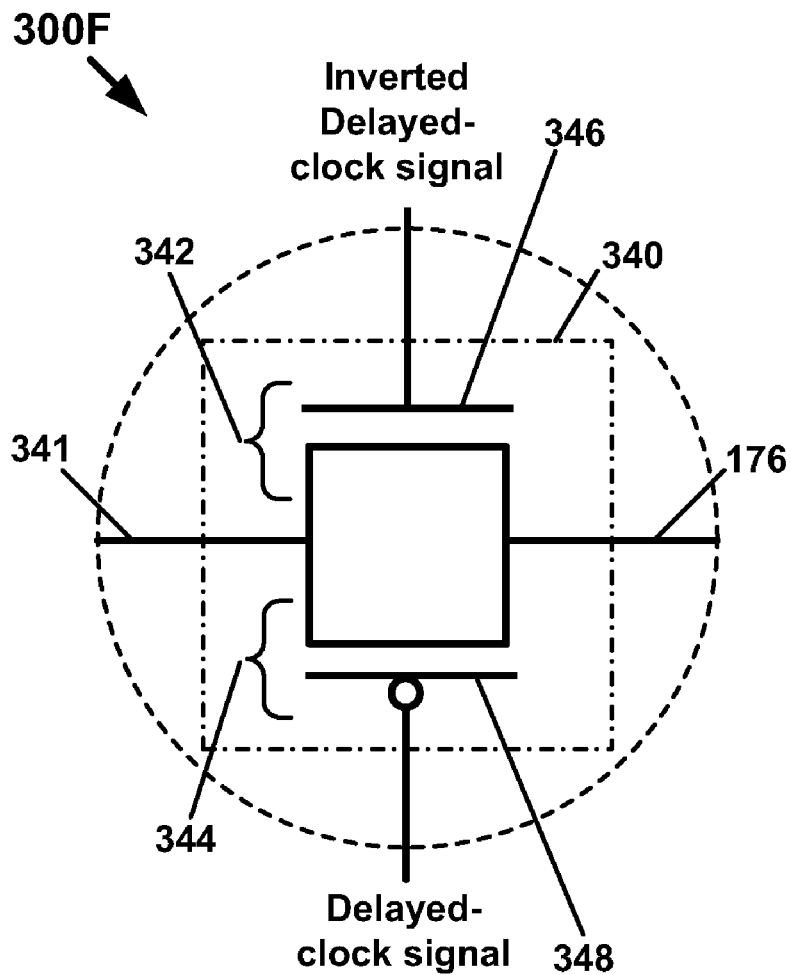
FIG. 3F is a circuit diagram illustrating an arrangement of FETs within the second switch of the second switching mechanism of an oscillator, such as the example relaxation oscillator of FIG. 1A, in an embodiment of the present invention.

With reference now to FIG. 3F, in accordance with another embodiment of the present invention, a circuit diagram 300F of the second switch 340 that is enclosed in circle 3F is shown; circuit diagram 300F illustrates an arrangement of FETs within the second switch 340 of the second switching mechanism 170 of an oscillator, such as the example relaxation oscillator 101 of FIG. 1A. The second switch 340 of the second switching mechanism 170 includes an n-FET 342 and may also include a p-FET 344, which may be connected in parallel; the drain of the p-FET 344 may be electrically coupled to the drain of the n-FET 342, which may be electrically coupled in common with the second output 176 of the second switching mechanism 170; and, the source of the p-FET 344 may be electrically coupled to the source of the n-FET 342, which may be electrically coupled in common with the input 341 of the second switch 340, which is electrically coupled to the second switching mechanism input 172 of the second switching mechanism 170. The signal 178, which may include the inverted delayed clock signal of TP$_{10}$, may be applied to gate 346 of the n-FET 342 so that the channel of n-FET 342 goes to a high resistance state when the delayed clock signal, -delayed clock signal, goes low, which effectively opens the second switch 340. If the second switch 340 is also provided with the p-FET 344, the signal 178 may also include the delayed clock signal of TP$_9$, which may be applied to gate 348 of the p-FET 344 so that the channel of p-FET 344 goes to a high resistance state when the delayed clock signal goes high, which also effectively opens the second switch 340. Thus, in an embodiment of the present invention, the signal 178 may include a third signal, which may be a delayed clock signal applied to the gate 348 of the p-FET 344, and a fourth signal, which may be an inverted delayed clock signal applied to the gate 346 of the n-FET 342. On the other hand, if the delayed clock signal goes high, the gate 346 of the n-FET 342 goes high, which effectively closes the second switch 340. If the second switch 340 is also provided with the p-FET 344, the signal 178 may also include the inverted delayed clock signal applied to the gate 348 of the p-FET 344 so that when the inverted delayed clock signal goes low, second switch 340 effectively closes. Thus, the p-FET 344 also a complimentary path for the input signal of the second switch 340, which increases the conductance of the second switching mechanism 170.

With further reference to FIG. 3D, in accordance with one embodiment of the present invention, the circuit diagram 300D that illustrates the switch configuration of the second switching mechanism 170 is similar to the switch configuration of the third switching mechanism 130. The third switching mechanism 130 also includes a first switch (not shown), which is configured similarly to the first switch 310 of the second switching mechanism 150, and a second switch (not shown), which is configured similarly to the second switch 320 of the second switching mechanism 150. However, the first switch of the third switching mechanism 130 closes in response to the signal 138 and creates continuity between the first output 134 of the third switching mechanism 130 and the third switching mechanism input 132, by means of an input of the first switch electrically coupled to the third switching mechanism input 132, which is configured similarly to the input 331 of the first switch 330 of the second switching mechanism 170. The second switch of the third switching mechanism 130 opens in response to the signal 138 and breaks continuity between the second output 136 of the third switching mechanism 130 and the third switching mechanism input 132, by means of an input of the second switch electrically coupled to the third switching mechanism input 132, which is configured similarly to the input 341 of the second switch 340 of the second switching mechanism 170. In one embodiment of the present invention, the signal 138 includes the clock signal of $TP_8$. The first switch of the third switching mechanism 130 may also include an arrangement of FETs within the first switch, which is similar to the arrangement of FETs within the second switch 330 of the second switching mechanism 170 as shown in FIG. 3E. In addition, the second switch of the third switching mechanism 130 may also include an arrangement of FETs within the second switch, which is similar to the arrangement of FETs within the second switch 340 of the second switching mechanism 170 as shown in FIG. 3F. Similarly, the signal 138 may include the first signal, which may include the clock signal of $TP_8$ applied to gates of FETs correspondingly similar to the gates of FETs shown in FIGS. 3E and 3F, and a second signal, which may include the inverted clock signal of $TP_7$ applied to gates of FETs correspondingly similar to the gates of FETs shown in FIGS. 3E and 3F.

With further reference to FIGS. 1A and 2, in accordance with one embodiment of the present invention, the example relaxation oscillator 101 includes at least the comparator block 160 and the latch 181. The comparator block 160 includes the comparator input 164 that is configured to receive a first input signal, for example, similar to the first waveform of $TP_1$, in response to a first signal, for example, similar to the eighth waveform of $TP_8$, and is configured to receive a second input signal, for example, similar to the second waveform of $TP_2$, in response to a second signal, for example, similar to the seventh waveform of $TP_7$; the comparator block 160 also includes the comparator output 168. The latch includes the latch-set input 183 that is configured to be coupled to the comparator output 168 in response to a third signal, for example, similar to the ninth waveform of $TP_9$, the latch-reset input 184 that is configured to be coupled to the comparator output 168 in response to a fourth signal, for example, similar to the tenth waveform of $TP_{10}$, and the latch output 185 that is configured to output the second signal, for example, similar to the seventh waveform of $TP_7$. The example relaxation oscillator 101 is configured to achieve an approximately fifty percent duty cycle without requiring use of a second comparator.

With further reference to FIGS. 1A and 2, in accordance with another embodiment of the present invention, the example relaxation oscillator 101 may include the first switching mechanism 150, the comparator block 160, the second switching mechanism 170 and the latch 181. The first switching mechanism may include the first switching mechanism output 156, the first input 152 that is configured to couple the first input signal, for example, similar to the first waveform of $TP_1$, to the first switching mechanism output 156 in response to a first signal, for example, similar to the eighth waveform of $TP_8$, and the second input 154 that is configured to couple a second input signal, for example, similar to the second waveform of $TP_2$, to the first switching mechanism output 156 in response to a second signal, for example, similar to the seventh waveform of $TP_7$. The comparator block 160 includes the comparator input 164 that is coupled to the first switching mechanism output 156 and the comparator output 168. The second switching mechanism 170 includes the second switching mechanism input 172 that is coupled to the comparator output 168, the first output 174 of the second switching mechanism 170 that is configured to couple to the comparator output 168 in response to a third signal, for example, similar to the ninth waveform of $TP_9$, and the second output 176 of the second switching mechanism 170 that is configured to couple to the comparator output 168 in response to a fourth signal, for example, similar to the tenth waveform of $TP_{10}$. The latch 181 includes the latch-set input 183 that is coupled to the first output 174 of the second switching mechanism 170, the latch-reset input 184 that is coupled to the second output 176 of the second switching mechanism 170 and the latch output 185 that is configured to output the second signal, for example, similar to the seventh waveform of $TP_7$. The example relaxation oscillator 101 is configured to achieve an approximately fifty percent duty cycle.

With further reference to FIGS. 1A and 2, in accordance with embodiments of the present invention, the comparator input 164 of the comparator block 160 is coupled to the first input signal, for example, similar to the first waveform at $TP_1$, in response to the first signal, for example, similar to the eighth waveform of $TP_8$; the comparator input 164 of the comparator block 160 is also coupled to a second input signal, for example, similar to the second waveform at $TP_2$, in response to a second signal, for example, similar to the seventh waveform of $TP_7$. The alternate coupling to the first input signal and the second input signal by this first switching mechanism 150 produces a comparator input signal, for example, similar to the third waveform of $TP_3$, at the comparator input 164. A positive-going ramp portion between time, $T_1$, and time, $T_2$, of the first input signal, which becomes a first portion of the comparator input signal between time, $T_1$, and time, $T_2$, is compared against a reference voltage, $V_{ref}$, as shown in FIG. 2. The reference voltage, $V_{ref}$, may be provided to the reference voltage input 166 from an external reference voltage source; or, the reference voltage, $V_{ref}$, may be provided by an internal reference voltage of the comparator block 160, itself. A first pulse portion of a first triggering signal, for example, the portion of the comparator output signal at $TP_4$ between time, $T_6$, and time, $T_2$, is generated on the comparator output 168 of the comparator block 160 after the first input signal substantially equals the reference voltage, $V_{ref}$, which occurs when the positive-going ramp portion between time, $T_1$, and time, $T_2$, of the first input signal crosses the threshold of the reference voltage, $V_{ref}$, at time, $T_6$. Because the first input signal is a periodically repeating signal, the first pulse portion of a first triggering signal is generated periodically, for example, again on the comparator output 168 at $TP_4$ between time, $T_{10}$, and time, $T_4$, after the positive-going ramp portion between time, $T_3$, and time, $T_4$, of the first input signal crosses the threshold of the reference voltage, $V_{ref}$, once again, at time $T_8$. In one embodiment of the present invention, the first triggering signal may include the pulse portions of the comparator output signal at $TP_4$, for example, between time, $T_6$, and time, $T_2$, and between time, $T_{10}$, and time, $T_4$, which become the latch-set input signal at $TP_5$, which is subsequently described.

With further reference to FIGS. 1A and 2, in accordance with embodiments of the present invention, a positive-going ramp portion between time, $T_2$, and time, $T_3$, of the second input signal, which becomes a second portion of the comparator input signal between time, $T_2$, and time, $T_3$, is compared against the reference voltage, $V_{ref}$, as shown in FIG. 2. A second pulse portion of a second triggering signal, for example, the portion of the comparator output signal at $TP_4$ between time, $T_8$, and time, $T_3$, is generated on the comparator output 168 of the comparator block 160 after the second input signal substantially equals the reference voltage, $V_{ref}$, which occurs when the positive-going ramp portion between time, $T_2$, and time, $T_3$, of the second input signal crosses the threshold of the reference voltage, $V_{ref}$, at time, $T_8$. Because the second input signal is a periodically repeating signal, the second pulse portion of the second triggering signal is generated periodically, for example, again on the comparator output 168 at $TP_4$ between time, $T_{12}$, and time, $T_5$, after the positive-going ramp portion between time, $T_4$, and time, $T_5$, of the second input signal crosses the threshold of the reference voltage, $V_{ref}$, once again, at time $T_{12}$. In another embodiment of the present invention, the second triggering signal may include the pulse portions of the comparator output signal at $TP_4$, for example, between time, $T_8$, and time, $T_3$, and between time, $T_{12}$, and time, $T_5$, which become the latch-reset input signal at $TP_6$, which is next described.

With further reference to FIGS. 1A and 2, in accordance with embodiments of the present invention, the latch-set input 183 of latch 181 is coupled to the comparator output 168 in response to a third signal, for example, similar to the ninth waveform of $TP_9$. The latch-reset input 184 of the latch 181 is coupled to the comparator output 168 in response to a fourth signal, for example, similar to the tenth waveform of $TP_{10}$. The second signal, for example, similar to the seventh waveform of $TP_7$, on latch output 185 of the latch 181 is generated in response to the first triggering signal, for example, the pulse portion of the first triggering signal identified with the comparator output signal at $TP_4$ between time, $T_6$, and time, $T_2$, and the second triggering signal, for example, the pulse portion of the second triggering signal identified with the comparator output signal at $TP_4$ between time, $T_8$, and time, $T_3$. The second signal, for example, similar to the seventh waveform of $TP_7$, on latch output 185 is input to inverter input 186; inverter 182 inverts the second signal and produces the first signal, for example, similar to the eighth waveform of $TP_8$.

With further reference to FIGS. 1A and 2, in accordance with embodiments of the present invention, the example relaxation oscillator 101 may be further configured as next described. In one embodiment of the present invention, the first signal may include a first clock signal, for example, similar to the clock signal of the eighth waveform of $TP_8$. In another embodiment of the present invention, the second signal may include an inverted first clock signal, for example, similar to the inverted clock signal of the seventh waveform of $TP_7$. In another embodiment of the present invention, the example relaxation oscillator 101 may further include the delay block 190; the delay block 190 includes the delay circuit 191 that is configured to introduce a delay into the first clock signal, for example, similar to the clock signal of the eighth waveform of $TP_8$, to produce a delayed first clock signal, for example, similar to the delayed clock signal of the ninth waveform of $TP_9$, and the inverter 192 that is configured to invert the delayed first clock signal to produce an inverted, delayed first clock signal, for example, similar to the inverted delayed clock signal of the tenth waveform of $TP_{10}$. As used herein, the following terms of art may be referred to by the following alternative, equivalent terms of art: a "delayed clock signal" may be referred to alternatively as a "clock signal with a delay;" and "inverted delayed clock signal," alternatively as an "inverted clock signal with a delay;" a "delayed first clock signal," alternatively as a "first clock signal with a delay;" and, an "inverted delayed first clock signal," alternatively as an "inverted first clock signal with a delay." In another embodiment of the present invention, the third signal may include a second clock signal, for example, similar to the ninth waveform of $TP_9$. Alternatively, in another embodiment of the present invention, the second clock signal may include the first clock signal with a delay such that the delay is adapted to adjust for a phase shift in a comparator output signal, for example, the fourth waveform at $TP_4$, such that the timing of the coupling of the latch-set input 183 to the comparator output 168 is properly synchronized. In another embodiment of the present invention, the fourth signal may include an inverted second clock signal, for example, similar to the tenth waveform of $TP_{10}$. Alternatively, in another embodiment of the present invention, the inverted second clock signal may include an inverted first clock signal with a delay, for example, similar to the inverted delayed clock signal of the tenth waveform of $TP_{10}$, such that the delay is adapted to adjust for a phase shift in a comparator output signal, for example, the fourth waveform at $TP_4$, such that the timing of the coupling of the latch-reset input 184 to the comparator output 168 is properly synchronized. As used herein, the phrase "properly synchronized" with respect to the synchronization of the latch-set input 183 with the comparator output 168 and with respect to the synchronization of the latch-reset input 184 with the comparator output 168 means that the respective inputs of the latch 181 are synchronized with the comparator output signal, for example, the fourth waveform at $TP_4$, so that the delay introduced into the comparator output signal is compensated to allow for the generation of a latch output signal, for example, the second signal of the seventh waveform at $TP_7$, and the first clock signal on the inverter output 187 with a phase relationship that maintains regenerative feedback to produce oscillation in the example relaxation oscillator 101 through positive feedback by the first clock signal, which is the first signal, and the inverted first clock signal, which is the second signal, to the first switching mechanism 150.

With further reference to FIGS. 1A and 2, in accordance with embodiments of the present invention, the example relaxation oscillator 101 may also be configured as next described. In one embodiment of the present invention, the example relaxation oscillator 101 may further include the third switching mechanism 130; the third switching mechanism 130 is configured to couple the first capacitor 112 with the current source 142 in response to the first signal, for example, similar to the clock signal of the eighth waveform of $TP_8$, to produce the first input signal, for example, similar to the first waveform of $TP_1$, on the first input 152 of the first switching mechanism 150; and, the third switching mechanism 130 is also configured to couple the second capacitor 122 with the current source 142 in response to the second signal, for example, similar to the inverted clock signal of the seventh waveform of $TP_7$, to produce the second input signal, for example, similar to the second waveform of $TP_2$, on the second input 154 of the first switching mechanism 150. In another embodiment of the present invention, the first input signal, for example, a first waveform at $TP_1$, may include a first sawtooth waveform, for example, similar in form to the third waveform of $TP_3$; and the second input signal, for example, a first waveform at $TP_2$, may include a second sawtooth waveform, for example, similar in form to the third waveform of $TP_3$. Alternatively, in embodiments of the present invention, the first input signal and the second input signal may have a variety of alternative waveform types: an RC charge-discharge waveform, a combined positive-going ramp and negative-going ramp waveform as may be produced when a current-source charges and discharges a capacitor, a combined RC charge and negative-going ramp waveform, a combined positive-going ramp and RC discharge waveform that is similar to the first waveform of $TP_1$ shown in FIG. 2, a triangle waveform, or other periodically repeating waveform. In another embodiment of the present invention, the third signal may include a delayed first clock signal, for example, similar to the delayed clock signal of the ninth waveform of $TP_9$, such that the delay is adapted to adjust for a phase shift in a comparator output signal, for example, the fourth waveform at $TP_4$, so that the timing of the coupling of the latch-set input 183 to the comparator output 168 is properly synchronized. In another embodiment of the present invention, the fourth signal may include the inverted delayed first clock signal, for example, similar to the inverted delayed clock signal of the tenth waveform of $TP_{10}$, such that the delay is adapted to adjust for a phase shift in a comparator output signal, for example, the fourth waveform at $TP_4$, so that the timing of the coupling of the latch-reset input 184 to the comparator output 168 is properly synchronized.

The above described design of the example relaxation oscillator 101 provides an approximately fifty percent duty cycle in the main high speed clock of integrated circuits (ICs). This enables circuit designers to design circuits (both analog and digital) under more relaxed timing constraints, thereby decreasing time-to-market and decreasing circuit complexity and die size. In contrast with standard relaxation oscillator architecture, the above described design of the example relaxation oscillator 101 achieves several economies through the elegant use of circuit components. For example, in one embodiment of the present invention, the same comparator block 160 is used for both the first input signal and the second input signal of the example relaxation oscillator 101, which may be positive-going ramp signals as described above. As a second example, in another embodiment of the present invention, the first input signal, for example, a first positive-going ramp waveform portion, and the second input signal, for example, a second positive-going ramp waveform portion, may be generated from a single current source, for example, current source 142, charging two different capacitors 112 and 122. By using two different capacitors 112 and 122, the discharge time of one capacitor does not cut into the time to charge the capacitor associated with the generation of the positive-going ramp signal. As another example, in another embodiment of the present invention, a relaxation oscillator with an approximately fifty percent duty cycle is achieved by using a single comparator, for example, similar to comparator block 160, and a single latch, for example, similar to latch 181, to process the signals generating the clock signal, for example, the eighth waveform at $TP_8$.

With further reference to FIGS. 1A, 1B and 2, in accordance with embodiments of the present invention, a frequency of the example relaxation oscillator 101 is given by:

$$V = 1/(T_{high} + T_{low})$$

where $T_{high}$ is defined as a time interval 212 between time, $T_1$, and time, $T_2$, of positive going portion of the clock signal, for example, the eighth waveform of $TP_8$; $T_{low}$ is defined as a time interval 214 between time, $T_2$, and time, $T_3$, of negative going portion of the clock signal, for example, the eighth waveform of $TP_8$. $T_{charge1}$ is defined as time interval 222 between time, $T_1$, and time, $T_6$. $T_{charge1}$ is the time to reach the threshold of the reference voltage, $V_{ref}$, of the positive-going ramp portion of the comparator input signal, for example, the third waveform of $TP_3$. Further, $T_{charge1}$ corresponds to the positive-going ramp portion of the first input signal. $T_{charge2}$ is defined as time interval 224 between time, $T_2$, and time, $T_8$. $T_{charge2}$ is the time to reach the threshold of the reference voltage, $V_{ref}$, of the positive-going ramp portion of the comparator input signal, for example, the third waveform of $TP_3$ Further, $T_{charge2}$ corresponds to the positive-going ramp portion of the second input signal. The capacitance, $C_1$, of the first capacitor 112 may be made equal to the capacitance, $C_2$, of the second capacitor 122, which is made possible by modern, mature IC foundry processes capable of making capacitors with well-matched capacitances. Through the use of the single comparator, for example, comparator block 160, in embodiments of the present invention, the reference voltage, $V_{ref}$, of the positive-going ramp portion of the first input signal is the same as the reference voltage, $V_{ref}$, of the positive-going ramp portion of the second input signal. Also, through use of a single current source, for example, current source 142, in embodiments of the present invention, the charging current, $I_{charge}$, for both the positive-going ramp portion of the first input signal and the positive-going ramp portion of the second input signal is the same. Therefore, $T_{charge1}$ is equal to $T_2$, where $T_{charge1}$ and $T_{charge2}$ each represent the amount of time to reach the threshold voltage of the reference voltage, $V_{ref}$. As shown in FIG. 2, $T_{charge1}$ is represented as time interval 222 between time $T_1$, and time, $T_6$, and $T_{charge2}$ is represented as time interval 224 between time $T_2$, and time, $T_8$. $T_{high}$ and $T_{low}$ are given by:

$$T_{high} = T_{charge1} + T_{delay1}$$

and $T_{low} = T_{charge2} + T_{delay2}$ where $T_{delay1}$, may be defined as the sum of the delay for signal processing in the comparator block 160 of the first positive-going ramp portion of the first input signal, and of the delay for signal processing in the latch 181; $T_{delay2}$, may be defined as the sum of the delay for signal processing in the comparator block 160 of the second positive-going ramp portion of the second input signal, and of the delay for signal processing in the latch 181. But, in accordance with embodiments of the present invention, because the comparator input signal, composed of the positive-going ramp portions of the first input signal and the second input signal is processed by the single comparator, for example, comparator block 160, and the single latch, for example, latch 181, the delay for signal processing in the comparator block 160 and the latch 181 for the first positive-going ramp portion of the first input signal, $T_{delay1}$, is equal to the delay for signal processing in the comparator block 160 and the latch 181 for the first positive-going ramp portion of the second input signal, $T_{delay2}$. Consequently, for embodiments of the present invention, $T_{high}$, the time interval 212 between time, $T_1$, and time, $T_2$, of positive-going going portion of the clock signal is equal to $T_{low}$, the time interval 214 between time, $T_2$, and time, $T_3$, of negative going portion of the clock signal. For embodiments of the present invention, because the duty cycle of the example relaxation oscillator 101 is defined by:

$$\text{Duty Cycle} = T_{high}/(T_{high} + T_{low})$$

where $T_{high} + T_{low}$ is defined by a time interval 210 between time, $T_1$, and time, $T_3$, of the clock signal, the example relaxation oscillator 101 has an approximately fifty percent duty cycle. The approximately fifty percent duty cycle is achieved by using the same comparator block 160 and the same latch 181.

Thus, other examples of economies achieved through embodiments of the present invention are that the clock signal with an approximately fifty percent duty cycle is produced without requiring use of a second comparator. Moreover, in accordance with embodiments of the present invention, the example relaxation oscillator 101 provides a general purpose oscillator that can be used for any application or IC that requires a stable oscillator. Furthermore, in accordance with embodiments of the present invention, the example relaxation oscillator 101 can be used in situations for which a more accurate fifty percent duty-cycle oscillator is used without the increased power consumption that results from running an oscillator at twice the nominal frequency and using a divider to get to a fifty percent duty cycle, as may be typically employed in standard relaxation oscillator architecture.

Figure 4A:
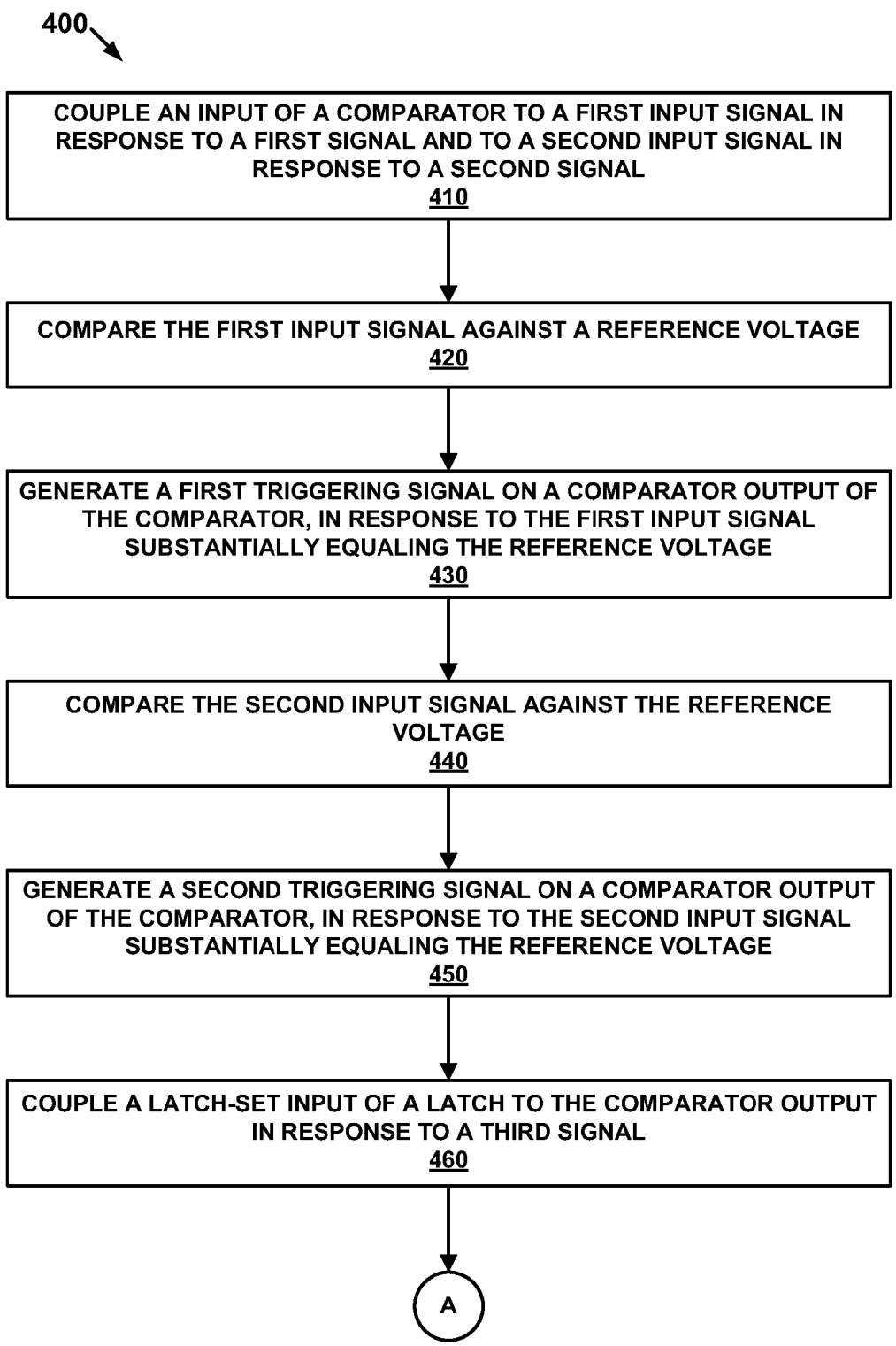
FIGS. 4A and 4B are a flow chart illustrating a method for producing a clock signal with an approximately fifty percent duty cycle utilizing an oscillator, such as the example relaxation oscillator of FIG. 1A, in an embodiment of the present invention.
Figure 4B:
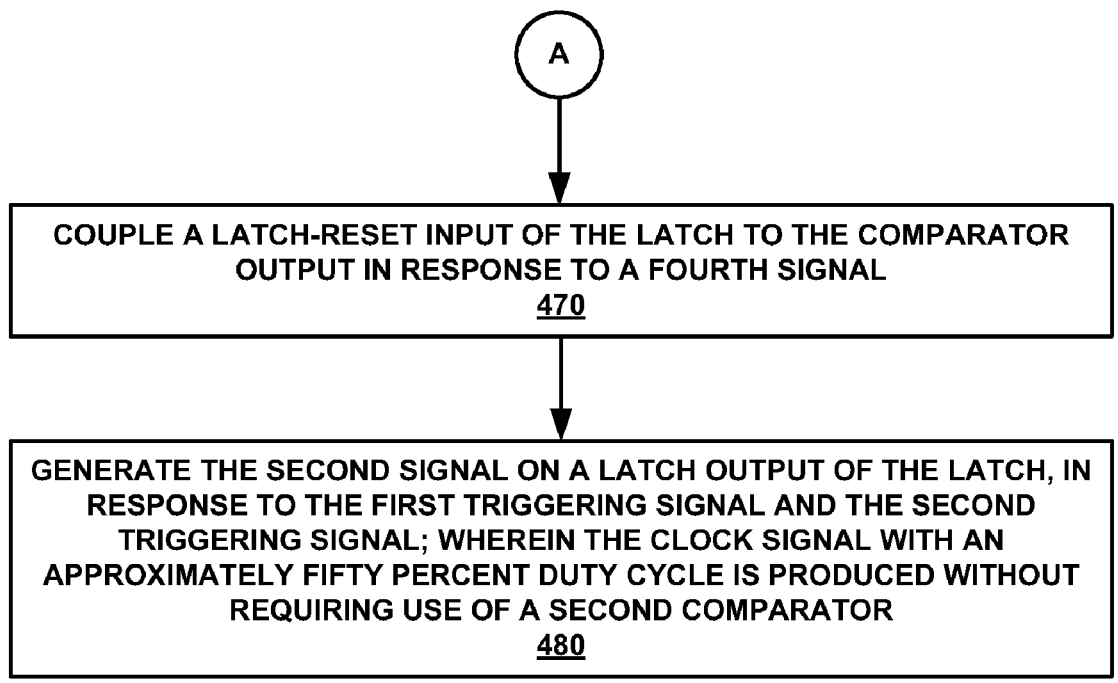

Description of Embodiments of the Present Invention for a Method for Producing a Clock Signal with an Approximately Fifty Percent Duty Cycle With reference now to FIGS. 4A and 4B, in accordance with an embodiment of the present invention, a flow chart 400 is shown. The flow chart 400 illustrates a method for producing a clock signal with an approximately fifty percent duty cycle utilizing an oscillator, such as the example relaxation oscillator of FIG. 1A. At 410, an input of a comparator is coupled to a first input signal in response to a first signal and to a second input signal in response to a second signal. At 420, the first input signal is compared against a reference voltage, $V_{ref}$. At 430, a first triggering signal is generated on a comparator output of the comparator, in response to the first input signal substantially equaling the reference voltage, $V_{ref}$. As used herein, the phrase "the first input signal substantially equaling the reference voltage" means that the first input signal crosses the threshold value of the reference voltage, $V_{ref}$. At 440, the second input signal is compared against the reference voltage, $V_{ref}$. At 450, a second triggering signal is generated on the comparator output of the comparator, in response to the second input signal substantially equaling the reference voltage, $V_{ref}$. As used herein, the phrase "the second input signal substantially equaling the reference voltage" means that the second input signal crosses the threshold value of the reference voltage, $V_{ref}$. At 460, a latch-set input of a latch is coupled to the comparator output in response to a third signal. At 470, a latch-reset input of the latch is coupled to the comparator output in response to a fourth signal. At 480, the second signal on a latch output of the latch is generated in response to the first triggering signal and the second triggering signal. In an embodiment of the present invention, the clock signal with an approximately fifty percent duty cycle is produced without requiring use of a second comparator. In one embodiment of the present invention, the first signal may include a first clock signal. In another embodiment of the present invention, the second signal may include an inverted first clock signal.

Figure 5:
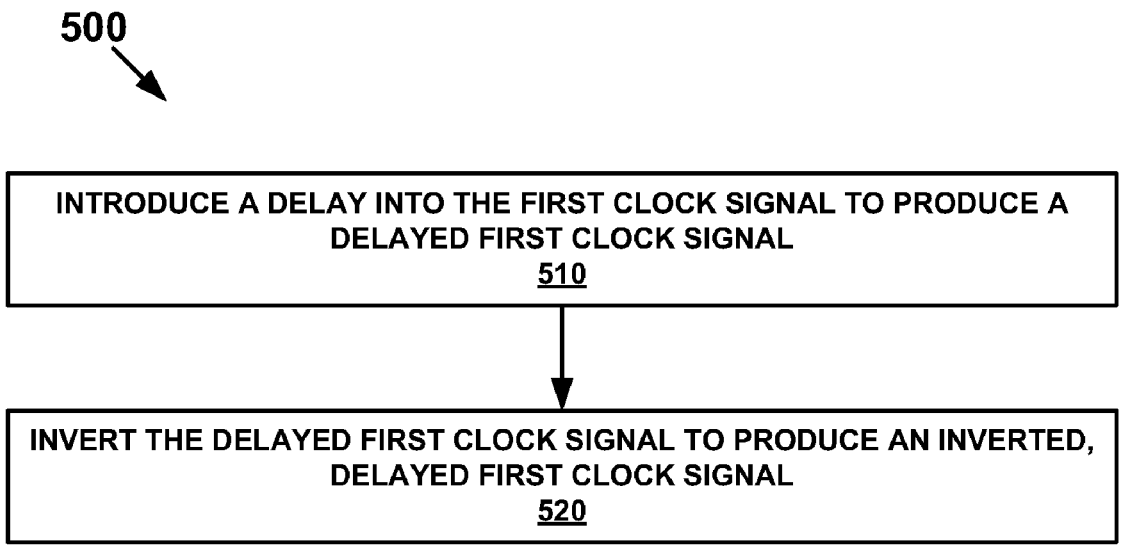
FIG. 5 is a flow chart illustrating further embodiments of the present invention for the method for producing a clock signal with an approximately fifty percent duty cycle utilizing an oscillator, such as the example relaxation oscillator of FIG. 1A, in an embodiment of the present invention.

With reference now to FIG. 5, in accordance with an embodiment of the present invention, a flow chart 500 is shown. The flow chart 500 illustrates further embodiments of the present invention for a method for producing a clock signal with an approximately fifty percent duty cycle utilizing an oscillator, such as the example relaxation oscillator of FIG. 1A. At 510, a delay is introduced into the first clock signal to produce a delayed first clock signal. At 520, the delayed first clock signal is inverted to produce an inverted, delayed first clock signal. In one embodiment of the present invention, the third signal may include the delayed first clock signal such that the delay is adapted to adjust for a phase shift in a comparator output signal so that the timing of the coupling of the latch-set input to the comparator output is properly synchronized. In another embodiment of the present invention, the fourth signal may include the inverted, delayed first clock signal such that the delay is adapted to adjust for a phase shift in a comparator output signal so that the timing of the coupling of the latch-reset input to the comparator output is properly synchronized.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A relaxation oscillator comprising:
   a comparator comprising:
      a comparator input configured to receive a first input signal in response to a first signal and configured to receive a second input signal in response to a second signal; and
      a comparator output;
   a latch comprising:
      a latch-set input configured to be coupled to said comparator output in response to a third signal;
      a latch-reset input configured to be coupled to said comparator output in response to a fourth signal; and
      a latch output configured to output said second signal; and
   a fourth switching mechanism, wherein said fourth switching mechanism is configured to couple said latch-reset input to ground when said latch-set input is coupled to said comparator output, and wherein said fourth switching mechanism is configured to couple said latch-set input to ground when said latch-reset input is coupled to said comparator output;
   wherein said relaxation oscillator is configured to achieve an approximately fifty percent duty cycle without requiring use of a second comparator.

2. The relaxation oscillator of claim 1, wherein said first signal comprises a first clock signal.

3. The relaxation oscillator of claim 2, further comprising:
   a delay block comprising:
      a delay circuit configured to introduce a delay into said first clock signal to produce a delayed first clock signal; and
      an inverter configured to invert said delayed first clock signal to produce an inverted, delayed first clock signal.

4. The relaxation oscillator of claim 1, wherein said second signal comprises an inverted first clock signal.

5. The relaxation oscillator of claim 1, wherein said third signal comprises a second clock signal.

6. The relaxation oscillator of claim 5, wherein said second clock signal comprises said first clock signal with a delay; and
   wherein said delay is adapted to adjust for a phase shift in a comparator output signal so that the timing of said coupling of said latch-set input to said comparator output is properly synchronized.

7. The relaxation oscillator of claim 1, wherein said fourth signal comprises an inverted second clock signal.

8. The relaxation oscillator of claim 7, wherein said inverted second clock signal comprises an inverted first clock signal with a delay; and
wherein said delay is adapted to adjust for a phase shift in a comparator output signal so that the timing of said coupling of said latch-reset input to said comparator output is properly synchronized.

9. A relaxation oscillator comprising:
a first switching mechanism comprising:
a first switching mechanism output;
a first input configured to couple a first input signal to said first switching mechanism output in response to a first signal; and
a second input configured to couple a second input signal to said first switching mechanism output in response to a second signal;
a comparator comprising:
a comparator input coupled to said first switching mechanism output; and
a comparator output;
a second switching mechanism comprising:
a second switching mechanism input coupled to said comparator output;
a first output of said second switching mechanism configured to couple to said comparator output in response to a third signal; and
a second output of said second switching mechanism configured to couple to said comparator output in response to a fourth signal;
a latch comprising:
a latch-set input coupled to said first output of said second switching mechanism;
a latch-reset input coupled to said second output of said second switching mechanism; and
a latch output configured to output said second signal; and
a fourth switching mechanism, wherein said fourth switching mechanism is configured to couple said latch-reset input to ground when said first output of said second switching mechanism is coupled to said comparator output, and wherein said fourth switching mechanism is configured to couple said latch-set input to ground when said second output of said second switching mechanism is coupled to said comparator output; and
wherein said relaxation oscillator is configured to achieve an approximately fifty percent duty cycle.

10. The relaxation oscillator of claim 9, further comprising:
a third switching mechanism, wherein said third switching mechanism is configured to couple a first capacitor with a current source in response to said first signal to produce said first input signal on said first input of said first switching mechanism; and
wherein said third switching mechanism is further configured to couple a second capacitor with said current source in response to said second signal to produce said second input signal on said second input of said first switching mechanism.

11. The relaxation oscillator of claim 9, wherein said first input signal comprises a first sawtooth waveform; and wherein said second input signal comprises a second sawtooth waveform.

12. The relaxation oscillator of claim 9, wherein said first signal comprises a first clock signal; and wherein said second signal comprises an inverted first clock signal.

13. The relaxation oscillator of claim 12, further comprising:
a delay block comprising:
a delay circuit configured to introduce a delay into said first clock signal to produce a delayed first clock signal; and
an inverter configured to invert said delayed first clock signal to produce an inverted delayed first clock signal.

14. The relaxation oscillator of claim 13, wherein said third signal comprises a delayed first clock signal;
wherein said delay is adapted to adjust for a phase shift in a comparator output signal so that the timing of said coupling of said latch-set input to said comparator output is properly synchronized.

15. The relaxation oscillator of claim 13, wherein said fourth signal comprises said inverted delayed first clock signal;
wherein said delay is adapted to adjust for a phase shift in a comparator output signal so that the timing of said coupling of said latch-reset input to said comparator output is properly synchronized.

16. A method for producing a clock signal with an approximately fifty percent duty cycle, said method comprising:
coupling an input of a comparator to a first input signal in response to a first signal and to a second input signal in response to a second signal;
comparing said first input signal against a reference voltage;
generating a first triggering signal on a comparator output of said comparator, in response to said first input signal substantially equaling said reference voltage;
comparing said second input signal against said reference voltage;
generating a second triggering signal on said comparator output of said comparator, in response to said second input signal substantially equaling said reference voltage;
coupling a latch-set input of a latch to said comparator output in response to a third signal,
coupling a latch-reset input of said latch to said comparator output in response to a fourth signal;
coupling said latch-reset input of said latch to ground when said latch-set input of said latch is coupled to said comparator output;
coupling said latch-set input of said latch to ground when said latch-reset input of said latch is coupled to said comparator output; and
generating said second signal on a latch output of said latch in response to said first triggering signal and said second triggering signal;
wherein said clock signal with an approximately fifty percent duty cycle is produced without requiring use of a second comparator.

17. The method recited in claim 16, wherein said first signal comprises a first clock signal; and wherein said second signal comprises an inverted first clock signal.

18. The method recited in claim 17, further comprising:
introducing a delay into said first clock signal to produce a delayed first clock signal; and
inverting said delayed first clock signal to produce an inverted, delayed first clock signal.

19. The method recited in claim 18, wherein said third signal comprises said delayed first clock signal;

wherein said delay is adapted to adjust for a phase shift in a comparator output signal so that the timing of said coupling of said latch-set input to said comparator output is properly synchronized.

20. The method recited in claim 18, wherein said fourth signal comprises said inverted, delayed first clock signal; wherein said delay is adapted to adjust for a phase shift in a comparator output signal so that the timing of said coupling of said latch-reset input to said comparator output is properly synchronized.

* * * * *